US012684920B2

(12) United States Patent
Jo et al.

(10) Patent No.: US 12,684,920 B2
(45) Date of Patent: Jul. 14, 2026

(54) DISPLAY DEVICE INCLUDING COVER LAYER OVERLAPPING BACK GATE ELECTRODE

(71) Applicant: Samsung Display Co., Ltd., Yongin-si (KR)

(72) Inventors: Sung Won Jo, Yongin-si (KR); Hyun Wook Lee, Yongin-si (KR); Su Min Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 708 days.

(21) Appl. No.: 17/356,346

(22) Filed: Jun. 23, 2021

(65) Prior Publication Data

US 2022/0093679 A1 Mar. 24, 2022

(30) Foreign Application Priority Data

Sep. 18, 2020 (KR) ........................ 10-2020-0120899

(51) Int. Cl.
$H10H\ 29/14$ (2025.01)
$H10H\ 20/815$ (2025.01)
$H10H\ 20/831$ (2025.01)

(52) U.S. Cl.
CPC ........ $H10H\ 29/142$ (2025.01); $H10H\ 20/815$ (2025.01); $H10H\ 20/8312$ (2025.01)

(58) Field of Classification Search
CPC . H01L 27/156; H01L 27/124; H01L 27/1214; H01L 33/12; H01L 33/382; H01L 25/167; H01L 25/0753; H01L 29/78648; H10H 20/84; H10H 20/852–854; H10H 29/842; H10H 29/852–854; H10H 20/819; H10H 20/82; H10H 20/821;
(Continued)

(56) References Cited

U.S. PATENT DOCUMENTS

| 2011/0316007 | A1* | 12/2011 | Sagawa | ................ | H10K 50/805 |
| | | | | | 257/E33.062 |
| 2017/0162822 | A1 | 6/2017 | Park et al. | | |
| 2017/0278901 | A1* | 9/2017 | Kim | .................... | H10K 59/124 |

(Continued)

FOREIGN PATENT DOCUMENTS

| JP | 2019-114557 A | 7/2019 |
| KR | 10-2017-0065051 A | 6/2017 |

(Continued)

OTHER PUBLICATIONS

Notice of Allowance issued in Korean Patent Application No. 10-2020-0120899 on Apr. 20, 2026, 6pp.

*Primary Examiner* — Jessica S Manno
*Assistant Examiner* — Andrew Chung
(74) *Attorney, Agent, or Firm* — Womble Bond Dickinson (US) LLP

(57) ABSTRACT

A display device includes a display area, a non-display area, and an open area between the display area and the non-display area. The display device includes a substrate; a transistor on the substrate, a back gate electrode, wherein at least a portion of the back gate electrode overlaps the transistor and at least another portion of the back gate electrode overlaps the open area, a passivation layer on the transistor, and including an opening that overlaps the open area, and a cover layer overlapping the back gate electrode in the open area.

14 Claims, 8 Drawing Sheets

(58) Field of Classification Search
CPC ..... H10H 20/831–8316; H10H 20/853; H10H
29/142; H10H 20/8321; H10H 20/815
See application file for complete search history.

(56) References Cited

U.S. PATENT DOCUMENTS

2021/0376210  A1     12/2021  Lee et al.
2022/0393058  A1*    12/2022  Binder ................. H10H 20/052

FOREIGN PATENT DOCUMENTS

KR       10-2019-0055774  A       5/2019
KR       10-2019-0063749  A       6/2019
KR       10-2021-0132278  A      11/2021
KR       10-2021-0149292  A      12/2021

* cited by examiner

OPA

PSV

ILD2

ILD1

COL

GI

BFL

BGE

BSL

OPA

PSV

ILD2

ILD1

COL

GI

BFL

BSL

III III'

DR3

DR1

DISPLAY DEVICE INCLUDING COVER LAYER OVERLAPPING BACK GATE ELECTRODE

CROSS-REFERENCE TO RELATED APPLICATION

This application claims priority to and the benefit of Korean patent application number 10-2020-0120899 filed on Sep. 18, 2020, the entire content of which is hereby incorporated by reference.

BACKGROUND

1. Field

Various embodiments of the present disclosure relate to a display device.

2. Description of Related Art

Recently, as interest in information display is increasing, research and development of display devices are continuously made.

SUMMARY

Various embodiments of the present disclosure are directed to a display device that can reduce external influences and prevent or reduce damage to electrode components during an etching process.

The present disclosure is not limited to the above-described objects, and other objects that are not mentioned will be clearly understood by those skilled in the art from the following description.

An embodiment of the present disclosure may provide a display device including a display area, a non-display area, and an open area between the display area and the non-display area, the display device further including a substrate; a transistor on the substrate; a back gate electrode where at least a portion thereof overlaps the transistor and at least another portion thereof overlaps the open area; a passivation layer on the transistor, and including an opening that overlaps the open area; and a cover layer overlapping the back gate electrode in the open area.

In an embodiment, the transistor may include a semiconductor layer including a first material, and the cover layer may include the first material.

In an embodiment, the transistor may include a semiconductor layer, and the semiconductor layer and the cover layer may be made of the same material.

In an embodiment, the first material may include polysilicon, amorphous silicon, and/or oxide semiconductor.

In an embodiment, the semiconductor layer and the cover layer may be formed in the same process.

In an embodiment, the display device may further include an interlayer insulating layer on the semiconductor layer, and including an opening that overlaps with the open area.

In an embodiment, at least a portion of the back gate electrode may be arranged between the substrate and the transistor, and another portion of the back gate electrode may be arranged between the substrate and the cover layer.

In an embodiment, the cover layer may be an etch stopper layer for the back gate electrode arranged in the open area, when an etching process for the passivation layer is performed.

In an embodiment, the display device may further include an insulating layer in the open area and arranged on the same layer as the passivation layer.

In an embodiment, the back gate electrode may include a first back gate electrode and a second back gate electrode that are arranged in the open area and are physically spaced apart from each other, and the cover layer may integrally cover the first back gate electrode and the second back gate electrode.

In an embodiment, the back gate electrode may include a first back gate electrode and a second back gate electrode that are arranged in the open area and are physically spaced apart from each other, and the cover layer may include a first cover layer and a second cover layer that are arranged in the open area and are physically spaced apart from each other, the first cover layer overlapping the first back gate electrode, and the second cover layer overlapping the second back gate electrode in a plan view.

In an embodiment, the back gate electrode in the open area may be arranged in an area where the cover layer is located, in a plan view.

In an embodiment, light may be provided to an outside in the display area, and light may not be provided to the outside in the non-display area.

In an embodiment, the open area may be provided in a shape enclosing at least a portion of the display area.

In an embodiment, the display device may further include a buffer layer on the back gate electrode; and a semiconductor layer on the buffer layer, wherein the semiconductor layer and the cover layer are on the same layer.

In an embodiment, the semiconductor layer and the cover layer may be covered by one insulating layer.

In an embodiment, the open area may be defined as an area where the passivation layer is not arranged.

The present disclosure is not limited to the above-described embodiments, and other embodiments that are not mentioned will be clearly understood by those skilled in the art from the present specification and the accompanying drawings.

BRIEF DESCRIPTION OF THE DRAWINGS

The accompanying drawings, together with the specification, illustrate embodiments of the subject matter of the present disclosure, and, together with the description, serve to explain principles of embodiments of the subject matter of the present disclosure.

FIGS. 6 and 7 are enlarged views illustrating area EA1 of FIG. 3.

FIG. 8 is a cross-sectional view taken along line II-II' of FIG. 6.

FIG. 9 is a cross-sectional view taken along line III-III' of FIG. 6.

DETAILED DESCRIPTION

Figure 1:
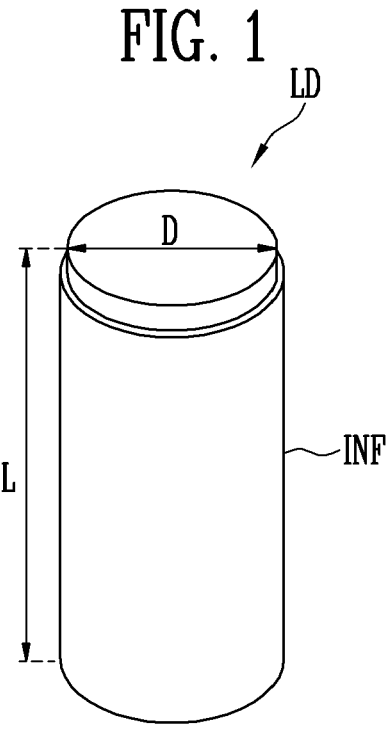
FIGS. 1 and 2 are a perspective view and a cross-sectional view, respectively, illustrating a light emitting element in accordance with an embodiment of the present disclosure.

Because the embodiments described herein are intended to clearly convey the spirit of the present disclosure to those skilled in the art, the present disclosure is not limited to the described embodiments. It should be understood that various changes and modifications may be made to the subject matter of the present disclosure without departing from the spirit and scope of the present disclosure.

Unless otherwise defined, all terms used herein have the same meaning as commonly understood by one of ordinary skill in the art to which this disclosure belongs, but may vary according to the intention of those skilled in the art, customs or emergence of new technologies. However, when specific terminology is defined as having a certain meaning, the meaning of the terminology will be described separately or explicitly. Therefore, the terminology used herein is for the purpose of describing particular embodiments only and is not intended to be limiting of the present disclosure.

The accompanying drawings are for the purpose of clearly describing particular embodiments, and may be exaggerated as necessary to aid in understanding of the present disclosure. The present disclosure is not limited to the embodiments shown in the drawings.

When it is determined that the detailed description of the known art related to the present disclosure may obscure the gist of the present disclosure, the detailed description will be omitted.

Various embodiments of the present disclosure relate to a display device. Hereinafter, the display device according to an embodiment will be described with reference to FIGS. 1 to 11.

Figure 2:
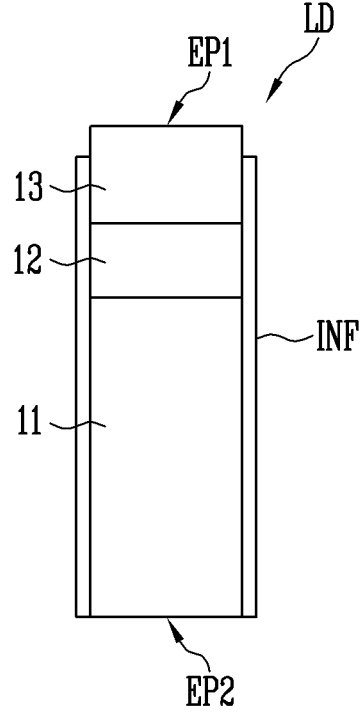

FIGS. 1 and 2 are a perspective view and a cross-sectional view illustrating a light emitting element in accordance with an embodiment of the present disclosure. Although FIGS. 1 and 2 illustrate a columnar light emitting element LD, the type, kind, and/or shape of the light emitting element LD are not limited thereto.

Referring to FIGS. 1 and 2, the light emitting element LD may include a first semiconductor layer 11, a second semiconductor layer 13, and an active layer 12 interposed between the first and second semiconductor layers 11 and 13. For example, when the extending direction of the light emitting element LD is called a longitudinal direction L, the light emitting element LD may include the first semiconductor layer 11, the active layer 12, and the second semiconductor layer 13 which are successively stacked in the longitudinal direction L.

The light emitting element LD may be in the shape of a column extending in one direction. The light emitting element LD may have a first end EP1 and a second end EP2. One selected from the first and second semiconductor layers 11 and 13 may be on the first end EP1 of the light emitting element LD. A remaining one selected from the first and second semiconductor layers 11 and 13 may be on the second end EP2 of the light emitting element LD.

In an embodiment, the light emitting element LD may be a light emitting element manufactured in a columnar shape through an etching method and/or the like. In this specification, the term "columnar shape" embraces a rod-like shape and a bar-like shape such as a cylindrical shape and a prismatic shape extending in the longitudinal direction L (e.g., to have an aspect ratio greater than 1), and the cross-sectional shape thereof is not limited to a particular shape. For example, a length L of the light emitting element LD may be greater than a diameter D thereof (or a width of the cross-section thereof).

The light emitting element LD may have a small size from a nanometer scale to a micrometer scale. For instance, the light emitting element LD may have a diameter D (or width) and/or a length L in a range from the nanometer scale to the micrometer scale. The size of the light emitting element LD is not limited thereto. The size of the light emitting element LD may be variously changed depending on design conditions of various devices using a light emitting device employing the light emitting element LD as a light source, for example, a display device.

The first semiconductor layer 11 may be a first conductive semiconductor layer. For example, the first semiconductor layer 11 may include an N-type semiconductor layer. For instance, the first semiconductor layer 11 may include an N-type semiconductor layer which includes any one semiconductor material including In-AlGaN, GaN, AlGaN, InGaN, AlN, and/or InN and is doped with a first conductive dopant such as Si, Ge, and/or Sn. However, the material forming the first semiconductor layer 11 is not limited to this, and the first semiconductor layer 11 may be formed of various other suitable materials.

The active layer 12 may be on the first semiconductor layer 11, and have a single-quantum well structure or a multi-quantum well structure. The location of the active layer 12 may be changed in various suitable ways depending on the type or kind of the light emitting element LD.

A cladding layer doped with a conductive dopant may be above and/or under the active layer 12. For example, the cladding layer may be formed of an AlGaN layer and/or an InAIGaN layer. In an embodiment, a material such as AlGaN and/or InAIGaN may be used to form the active layer 12, and various other suitable materials may be used to form the active layer 12.

The second semiconductor layer 13 may be on the active layer 12 and include a semiconductor layer having a type or kind of different from that of the first semiconductor layer 11. For example, the second semiconductor layer 13 may include a P-type semiconductor layer. For instance, the second semiconductor layer 13 may include a P-type semiconductor layer which includes any one semiconductor material including InAIGaN, GaN, AlGaN, InGaN, AlN, and/or InN, and is doped with a second conductive dopant such as Mg. However, the material forming the second semiconductor layer 13 is not limited to this, and the second semiconductor layer 13 may be formed of various other suitable materials.

If a voltage equal to or greater than a threshold voltage is applied to the opposite ends of the light emitting element LD, the light emitting element LD emits light by coupling electron-hole pairs in the active layer 12. Because light emission of the light emitting element LD can be controlled based on the foregoing principle, the light emitting element LD may be used as a light source of various suitable light emitting devices as well as a pixel of the display device.

The light emitting element LD may further include an insulating film INF on the surface of the light emitting element LD. The insulating film INF may be on the surface of the light emitting element LD to enclose an outer peripheral (e.g., circumferential) surface of at least the active layer 12. In addition, the insulating layer may further enclose an area of each of the first and second semiconductor layers 11 and 13.

In an embodiment, the insulating film INF may allow the opposite ends of the light emitting element LD that have different polarities to be exposed to the outside. For example, the insulating film INF may expose a first end of each of the first and second semiconductor layers 11 and 13 on the first and second ends EP1 and EP2 of the light emitting element LD. In another embodiment, the insulating film INF may expose a side of each of the first and second semiconductor layers 11 and 13 adjacent to the first and second ends EP1 and EP2 of the light emitting element LD having different polarities.

In an embodiment, the insulating film INF may have a single-layered structure or a multi-layered structure (e.g. a double-layered structure formed of aluminum oxide (AlOx) and silicon oxide (SiOx)) including at least one insulating material including silicon oxide (SiOx), silicon nitride (SiNx), silicon oxynitride (SiOxNy), aluminum oxide (AlOx), and/or titanium oxide (TiOx), but may not be limited thereto. In an embodiment, the insulating film INF may be omitted.

When the insulating film INF covers the surface of the light emitting element LD, for example, the outer peripheral (e.g., circumferential) surface of the active layer 12, the active layer 12 may prevent or reduce a likelihood or degree of a short-circuit with a first pixel electrode or a second pixel electrode which will be further described herein below. Consequently, the electrical stability of the light emitting element LD may be secured.

Furthermore, if the insulating film INF is on the surface of the light emitting element LD, occurrence of a defect on the surface of the light emitting element LD may be minimized or reduced, whereby the lifetime and efficiency of the light emitting element may be improved. In addition, even when the plurality of light emitting elements LD are in close contact with each other, it is possible to prevent or reduce an occurrence of an unwanted short circuit between the light emitting elements LD.

In an embodiment, the light emitting element LD may further include additional components as well as the first semiconductor layer 11, the active layer 12, the second semiconductor layer 13, and/or the insulating film INF surrounding them. For example, the light emitting element LD may further include at least one fluorescent layer, at least one active layer, at least one semiconductor layer and/or at least one electrode layer on one end of the first semiconductor layer 11, the active layer 12, and/or the second semiconductor layer 13. For instance, a contact electrode layer may be on each of the first and second ends EP1 and EP2 of the light emitting element LD. Although FIGS. 1 and 2 illustrate the columnar light emitting element LD, the type, kind, structure, and/or shape of the light emitting element LD may be changed in various suitable ways. For example, the light emitting element LD may have a core-shell structure having a poly-pyramid shape.

A light emitting device including the light emitting element LD described above may be used in various suitable devices including a display device which requires a light source. For instance, a plurality of light emitting elements LD may be in each pixel of a display panel, and the light emitting elements LD may be used as a light source of the pixel. However, the application field of the light emitting element LD is not limited to the above-mentioned examples. For example, the light emitting element LD may also be used in various suitable devices such as a lighting device, which uses or requires a light source.

Figure 3:
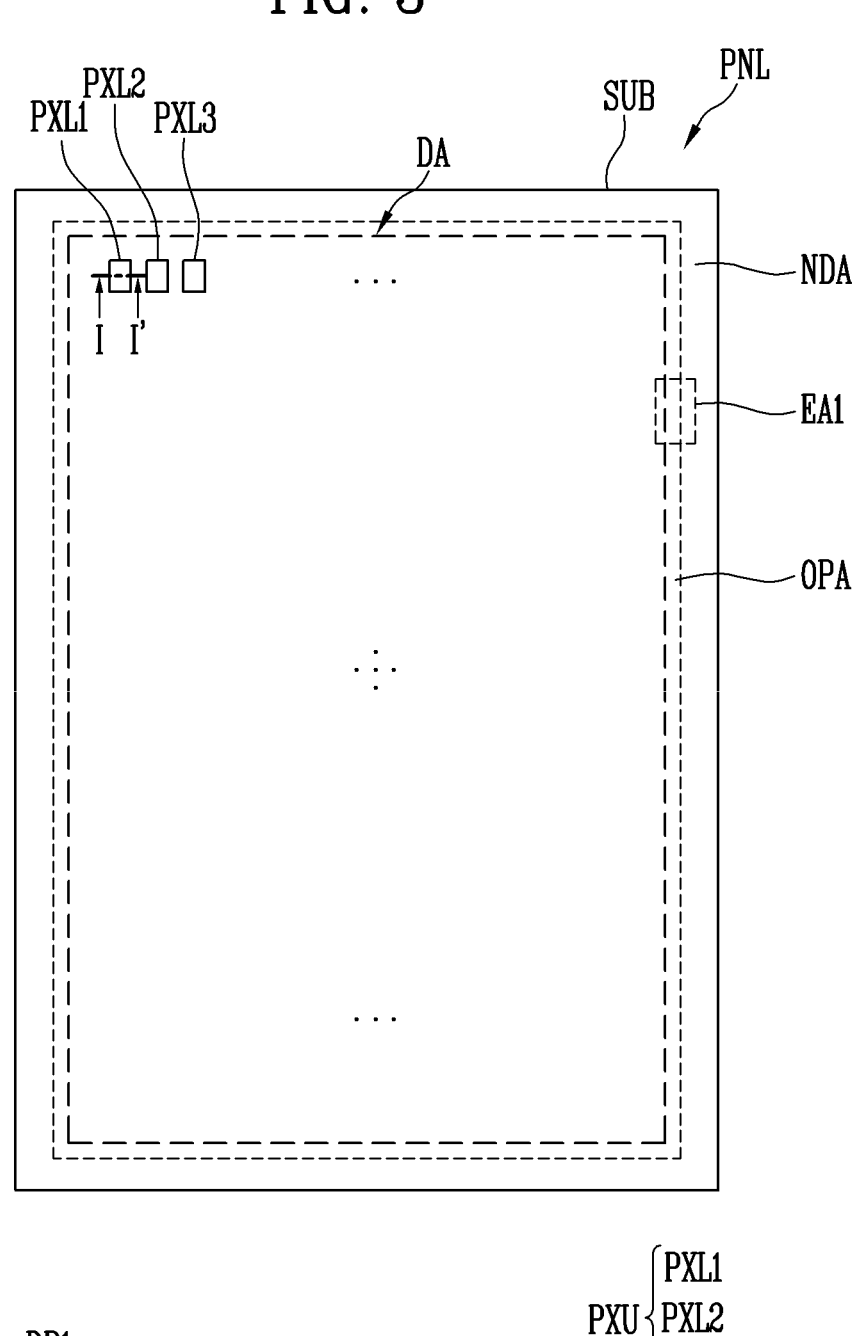
FIG. 3 is a plan view illustrating a display device in accordance with an embodiment of the present disclosure.

FIG. 3 is a plan view illustrating a display device in accordance with an embodiment of the present disclosure. FIG. 3 illustrates a display device, particularly, a display panel PNL in the display device, as an example of an electronic device which may use, as a light source, the light emitting element LD described with reference to FIGS. 1 and 2.

Each pixel unit PXU of the display panel PNL and each pixel constituting the pixel unit may include at least one light emitting element LD. For the sake of explanation, FIG. 3 simply illustrates the structure of the display panel PNL, focused on a display area DA. In some embodiments, at least one driving circuit component such as at least one of a scan driver and a data driver, lines and/or pads may be further on the display panel PNL.

Referring to FIG. 3, the display panel PNL may include a substrate SUB and a pixel unit PXU on the substrate SUB. The pixel unit PXU may include a first pixel PXL1, a second pixel PXL2, and/or a third pixel PXL3. Hereinafter, when referring to any one selected from the first pixel PXL1, the second pixel PXL2, and the third pixel PXL3 or when collectively referring to two or more types or kinds of pixels, they are referred to as a "pixel PXL" or "pixels PXL".

The substrate SUB may form a base member of the display panel PNL, and may be a rigid and/or soft substrate or film. For example, the substrate SUB may be a rigid substrate made of glass and/or reinforced glass, a soft substrate (or a thin film) made of plastic and/or metal material, and/or at least one insulating layer. The material and/or physical properties of the substrate SUB are not particularly limited.

In an embodiment, the substrate SUB may be substantially transparent. Here, the expression "substantially transparent" may mean that light may be transmitted with a set or predetermined transmittance. In an embodiment, the substrate SUB may be translucent or opaque. Furthermore, in an embodiment, the substrate SUB may include a reflective material.

The display panel PNL and the substrate SUB for forming the display panel PNL may include a display area DA for displaying an image, and a non-display area NDA in a set or predetermined area other than the display area DA.

The pixels PXL may be arranged in the display area DA. Various suitable lines, pads, and/or internal circuit components which are coupled to the pixels PXL of the display area DA may be in the non-display area NDA. The pixels PXL may be regularly arranged in a stripe or PENTILE® arrangement structure (e.g., an RGBG matrix, RGBG structure, or RGBG matrix). PENTILE® is a registered trademark of Samsung Display Co., Ltd. However, the arrangement structure of the pixels PXL is not limited thereto, and the pixels PXL may be arranged in various suitable structures and/or methods in the display area DA.

In an embodiment, two or more types or kinds of pixels PXL emitting light of different colors may be in the display area DA. For example, first pixels PXL1 emitting light of a first color, second pixels PXL2 emitting light of a second color, and third pixels PXL3 emitting light of a third color may be arranged in the display area DA. At least one first pixel PXL1, at least one second pixel PXL2, and at least one third pixel PXL3 that are adjacent to each other may form one pixel unit PXU which may emit light having various suitable colors. For example, each of the first to third pixels PXL1, PXL2 and PXL3 may be a sub-pixel that emits light of a set or predetermined color. In an embodiment, the first pixel PXL1 may be a red pixel which emits red light, a second pixel PXL2 may be a green pixel which emits green light, and a third pixel PXL3 may be a blue light which emits blue light. However, the present disclosure is not limited thereto.

In an embodiment, the first pixel PXL1, the second pixel PXL2, and the third pixel PXL3 may include, as light sources, a light emitting element related to the first color, a light emitting element related to the second color, and a light emitting element related to the third color, so that the pixels may respectively emit light having the first color, light having the second color, and light having the third color. In an embodiment, the first pixel PXL1, the second pixel PXL2, and the third pixel PXL3 may respectively include light emitting elements having the same color (e.g., that emit the same color), and photo conversion layers having different colors and/or a color filter are on the respective light emitting elements to emit light having the first color, light having the second color, and light having the third color. However, the colors, the types, kinds, and/or the numbers of pixels PXL that form each pixel unit PXU are not particularly limited. In other words, the color of light emitted by each pixel PXL may be variously changed.

The pixel PXL may include at least one light source which is driven by a set or predetermined control signal (e.g., a scan signal and a data signal) and/or a set or predetermined power source (e.g., a first power source and a second power source). In an embodiment, the light source may include at least one light emitting element LD according to any one of the embodiments of FIGS. 1 and 2, e.g., subminiature column-type light emitting elements LD having a small size in a range from a nanometer scale to a micrometer scale. However, the present disclosure is not limited to this. In addition, various suitable types or kinds of light emitting elements LD may be used as the light source of the pixel PXL.

In an embodiment, each pixel PXL may be formed of an active pixel. However, the types, kinds, structures, and/or driving schemes of the pixels PXL that may be applied to the display device are not particularly limited. For example, each pixel PXL may be a pixel of passive or active light emitting display devices having various suitable structures and/or driving schemes.

In an embodiment, the display panel PNL may include an open area OPA.

At least a portion of the open area OPA may be in the display panel PNL. The open area OPA may be located along a perimeter area of the display panel PNL. The open area OPA may enclose the display area DA.

The open area OPA may be between the display area DA and the non-display area NDA. In an embodiment, the open area OPA may be in the display area DA to enclose at least a portion of the display area DA, or the open area OPA may be in the non-display area NDA to enclose at least a portion of an area of the display panel PNL.

The open area OPA may mean an area from which at least some layers have been removed. The open area OPA may be defined as an area in which a passivation layer (see 'PSV' in FIG. 5) performing the function of a via layer is not arranged. Because the open area OPA will be described below in more detail with reference to FIGS. 6 to 11, a duplicated description thereof will not be repeated here.

Figure 4:
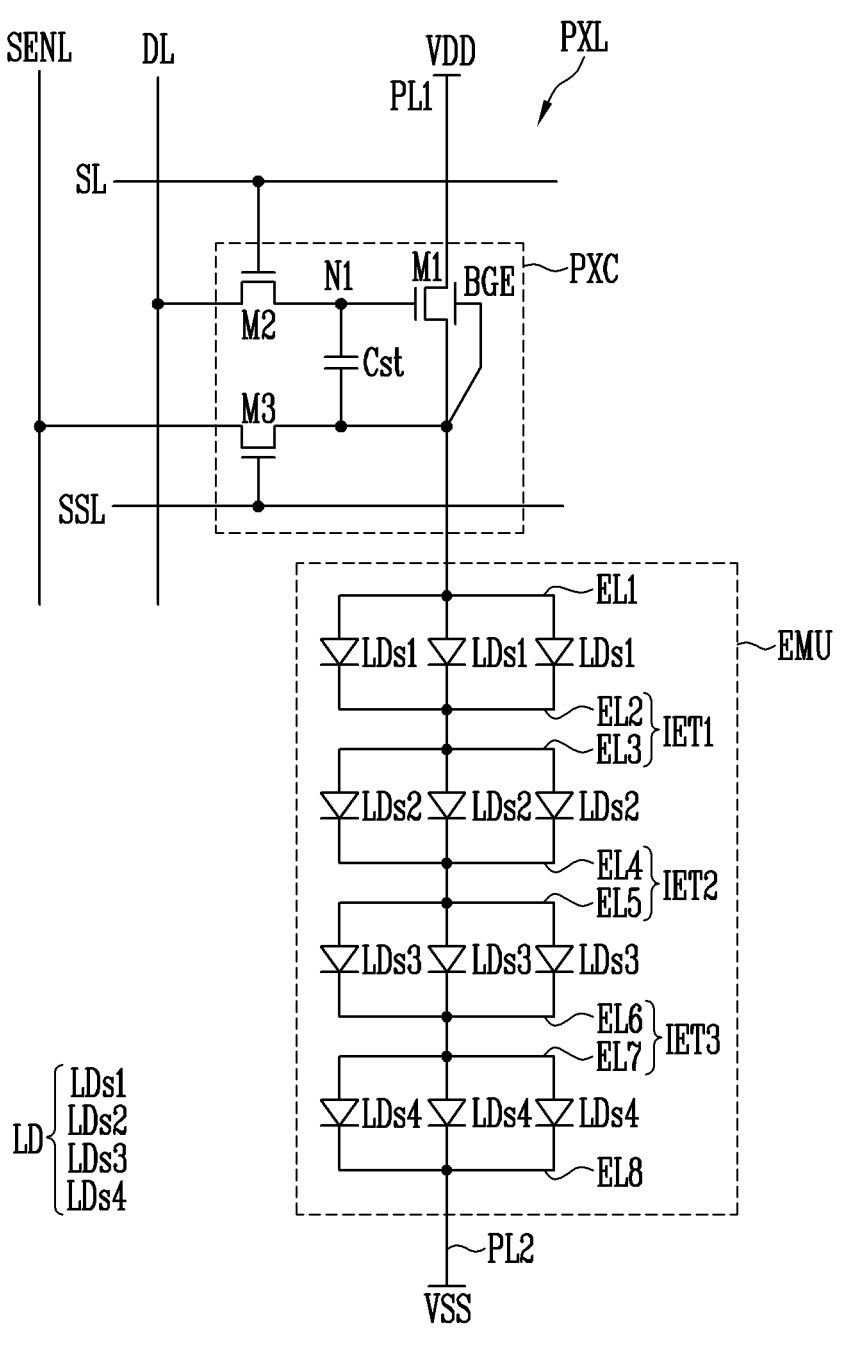
FIG. 4 is a circuit diagram illustrating a pixel in accordance with an embodiment of the present disclosure.

FIG. 4 is a circuit diagram illustrating a pixel in accordance with an embodiment of the present disclosure. For example, FIG. 4 illustrates an embodiment of a pixel PXL applicable to an active display device. However, the types or kinds of the pixel PXL and the display device to which embodiments of the present disclosure may be applied are not limited thereto.

In an embodiment, the pixel PXL shown in FIG. 4 may be any one selected from a first pixel PXL1, a second pixel PXL2, and a third pixel PXL3.

Referring to FIG. 4, the pixel PXL may include an emission component EMU for generating light having luminance corresponding to a data signal. The emission component EMU may include a light emitting element LD. The light emitting element LD may include a first light emitting element LDs1, a second light emitting element LDs2, a third light emitting element LDs3, and a fourth light emitting element LDs4. A pixel circuit PXC may drive the emission component EMU.

The emission component EMU may include the light emitting element LD coupled between a first power source VDD and a second power source VSS. A first end EP1 (e.g. a P-type end) of each of the light emitting elements LD may be coupled to the first power source VDD via the pixel circuit PXC and a first power line PL1, and a second end EP2 (e.g. an N-type end) of each of the light emitting elements LD may be coupled to the second power source VSS via a second power line PL2

In an embodiment, the light emitting elements LD may be coupled through various suitable coupling structures between the first power source VDD and the second power source VSS. For instance, the light emitting elements LD may be coupled to each other only in parallel or only in series. In some embodiments, the light emitting elements LD may be coupled in a serial/parallel mixed structure.

For example, as illustrated in FIG. 4, the light emitting elements LD may be divided into four serial stages and coupled to each other in series/parallel. In this case, each serial stage may include a pair of electrodes (e.g. two electrodes), and at least one light emitting element LD coupled between the pair of electrodes. Here, the numbers of the light emitting elements LD forming the respective serial stages may be equal to or different from each other, and the number of the light emitting elements LD is not particularly limited.

For example, a first serial stage may include a first electrode EI1, a second electrode EL2, and at least one first light emitting element LDs1 coupled between the first and second electrodes EL1 and EL2, and a second serial stage may include a third electrode EL3, a fourth electrode EL4, and at least one second light emitting element LDs2 coupled between the third and fourth electrodes EL3 and EL4. Likewise, a third serial stage may include a fifth electrode EL5, a sixth electrode EL6, and at least one third light emitting element LDs3 coupled between the fifth and sixth electrodes EL5 and EL6, and a fourth serial stage may include a seventh electrode EL7, an eighth electrode EL8, and at least one fourth light emitting element LDs4 coupled between the seventh and eighth electrodes EL7 and EL8.

The first electrode EL1 may be a first pixel electrode (or anode electrode) of the emission component EMU. The last electrode of the emission component EMU, e.g. the eighth electrode ELT8 may be a second pixel electrode (or a cathode electrode) of the emission component EMU.

The second to seventh electrodes EL2 to EL7 may form intermediate electrodes. For example, the second electrode EL2 and the third electrode EL3 may be integrally or non-integrally coupled to form a first intermediate electrode IET1. Likewise, the fourth electrode EL4 and the fifth electrode EL5 may be integrally or non-integrally coupled to form a second intermediate electrode IET2, and the sixth electrode EL6 and the seventh electrode EL7 may be integrally or non-integrally coupled to form a third intermediate electrode IET3. In this case, the second and third electrodes EL2 and EL3 may be integrated to be regarded as one first intermediate electrode IET1, the fourth and fifth electrodes EL4 and EL5 may be integrated to be regarded as one second intermediate electrode IET2, and the sixth and seventh electrodes EL6 and EL7 may be integrated to be regarded as one third intermediate electrode IET3.

Although FIG. 4 illustrates an embodiment in which the light emitting elements LD are coupled in a 4-stage serial/parallel mixed structure, the present disclosure is not limited thereto. For example, the light emitting elements LD may be coupled in a 2-stage serial or serial/parallel mixed structure, or the light emitting elements LD may be coupled in a serial or serial/parallel mixed structure of four or more stages.

Although FIG. 4 illustrates an embodiment in which the light emitting elements LD are coupled in a serial/parallel mixed structure, the present disclosure is not limited thereto. For example, the light emitting elements LD in the emission component EMU of each pixel PXL may be coupled to each other only in series or only in parallel.

Each of the light emitting elements LD may include the first end (e.g. the P-type end) coupled to the first power source VDD via the first pixel electrode (e.g. the first electrode EI1, the pixel circuit PXC, and/or the first power line PL1, and the second end (e.g. the N-type end) coupled to the second power source VSS via the second pixel electrode (e.g. the eighth electrode EL8) and the second power line PL2. In other words, the light emitting elements LD may be coupled in a forward direction between the first power source VDD and the second power source VSS. Each of the light emitting elements LD coupled in the forward direction may form each valid light source. The valid light sources may be collected to form the emission component EMU of the pixel PXL.

The first and second power sources VDD and VSS may have different potentials to allow the light emitting elements LD to emit light. For example, the first power source VDD may be set as a high-potential power source, and the second power source VSS may be set as a low-potential power source. Here, the first and second power sources VDD and VSS may have a potential difference such that the light emitting elements LD emit light during the light emission period of the pixel PXL.

The light emitting elements LD may emit light having a luminance corresponding to driving current supplied thereto through the corresponding pixel circuit PXC. For example, during each frame period, the pixel circuit PXC may supply driving current corresponding to a gray scale value that is to be expressed in the corresponding frame to the emission component EMU. Thus, while the light emitting elements LD emit light having luminance corresponding to the driving current, the emission component EMU may express the luminance corresponding to the driving current.

In an embodiment, the emission component EMU may further include at least one invalid light source, as well as the light emitting elements LD that form the respective valid light sources. For instance, at least one invalid light emitting element which is arranged in a reverse direction or at least one end of which is floated may be further coupled to at least one serial stage. The invalid light emitting element may maintain an inactive state even when a set or predetermined driving voltage (e.g. a forward driving voltage) is applied between the first and second electrodes EL1 and EL2, and thus may substantially maintain a non-emission state.

The pixel circuit PXC may be coupled between the first power source VDD and the emission component EMU. The pixel circuit PXC may be coupled to a scan line SL and a data line DL of the corresponding pixel PXL. Furthermore, the pixel circuit PXC may be selectively coupled to a sensing signal line SSL and a sensing line SENL.

The pixel circuit PXC may include a first transistor M1, a second transistor M2, a third transistor M3, and a storage capacitor Cst.

The first transistor M1 may be coupled between the first power source VDD and the first electrode EU of the emission component EMU. A gate electrode of the first transistor M1 may be coupled to the first node N1. The first transistor M1 may control a driving current supplied to the emission component EMU in response to the voltage of the first node N1. In other words, the first transistor M1 may be a drive transistor that controls the driving current of the pixel PXL.

The pixel circuit PXC may further include a back gate electrode BGE coupled to the first electrode EL1. The back gate electrode BGE may overlap the gate electrode with the insulating layer being therebetween.

The second transistor M2 may be coupled between the data line DL and the first node N1. A gate electrode of the second transistor M2 may be coupled to the scan line SL. When a scan signal of a gate-on voltage (e.g., a high level voltage) is supplied from the scan line SL, the second transistor M2 may be turned on to electrically couple the first node N1 to the data line DL.

For each frame period, the data signal of the corresponding frame is supplied to the data line DL. The data signal may be transmitted through the second transistor M2, which is turned on during a period when the scan signal of the gate-on voltage is supplied, to the first node N1. In other words, the second transistor M2 may be a switching transistor to transmit each data signal into the pixel PXL.

A first electrode of the storage capacitor Cst may be coupled to the first node N1, and a second electrode thereof may be coupled to the first electrode EU (or the second electrode of the first transistor M1) of the emission component EMU. Such a storage capacitor Cst may charge a voltage corresponding to the data signal supplied to the first node N1 during each frame period.

The third transistor M3 may be coupled between the first electrode EL1 of the emission component EMU and the sensing line SENL. A gate electrode of the third transistor M3 may be coupled to the sensing signal line SSL. Such a third transistor M3 may transmit a voltage value (or a voltage value applied to the anode electrode of the light emitting element LD) applied to the first electrode EL1 of the emission component EMU to the sensing signal SENL in response to the sensing signal supplied to the sensing signal line SSL during a set or predetermined sensing period. The voltage value transmitted through the sensing line SENL may be provided to an external circuit (e.g. timing controller), and the external circuit may extract the characteristic information (e.g. the threshold voltage of the first transistor M1) of each pixel PXL based on the provided voltage value. The extracted characteristic information may be used to convert input image data so that characteristic deviations between the pixels PXL are compensated.

Although in FIG. 4 the transistors, e.g., the first, second, and third transistors M1, M2, and M3, included in the pixel circuit PXC have been illustrated as being formed of N-type transistors, the present disclosure is not limited to this. In other words, at least one of the first, second, and third transistors M1, M2, and M3 may be changed to a P-type transistor. In an embodiment, the pixel circuit PXC may include P-type and N-type transistors in combination. For example, some of the transistors included in the pixel circuit PXC may be P-type transistors, and the remaining transistors may be N-type transistors. In this case, the voltage level of a control signal (e.g. a scan signal, a data signal, and/or a sensing signal) for driving each transistor may be adjusted depending on the type or kind of transistors.

Furthermore, the structure and driving method of the pixel PXL may be changed in various suitable ways according to an embodiment. For instance, the pixel circuit PXC may be a pixel circuit which may have various suitable structures and/or be operated in various suitable driving manners, in addition to the embodiment illustrated in FIG. 4.

For instance, the pixel circuit PXC may not include the third transistor M3. Furthermore, the pixel circuit PXC may further include other circuit elements, such as a transistor for compensating for the threshold voltage of the first transistor M1, a transistor for initializing the voltage of the first node N1 or the first electrode EL1 of the emission component EMU, a transistor for controlling a period when driving current is supplied to the emission component EMU, and/or a boosting capacitor for boosting the voltage of the first node N1. In an embodiment, when each pixel PXL is a pixel of a passive light emitting display device, the pixel circuit PXC may be omitted.

Figure 5:
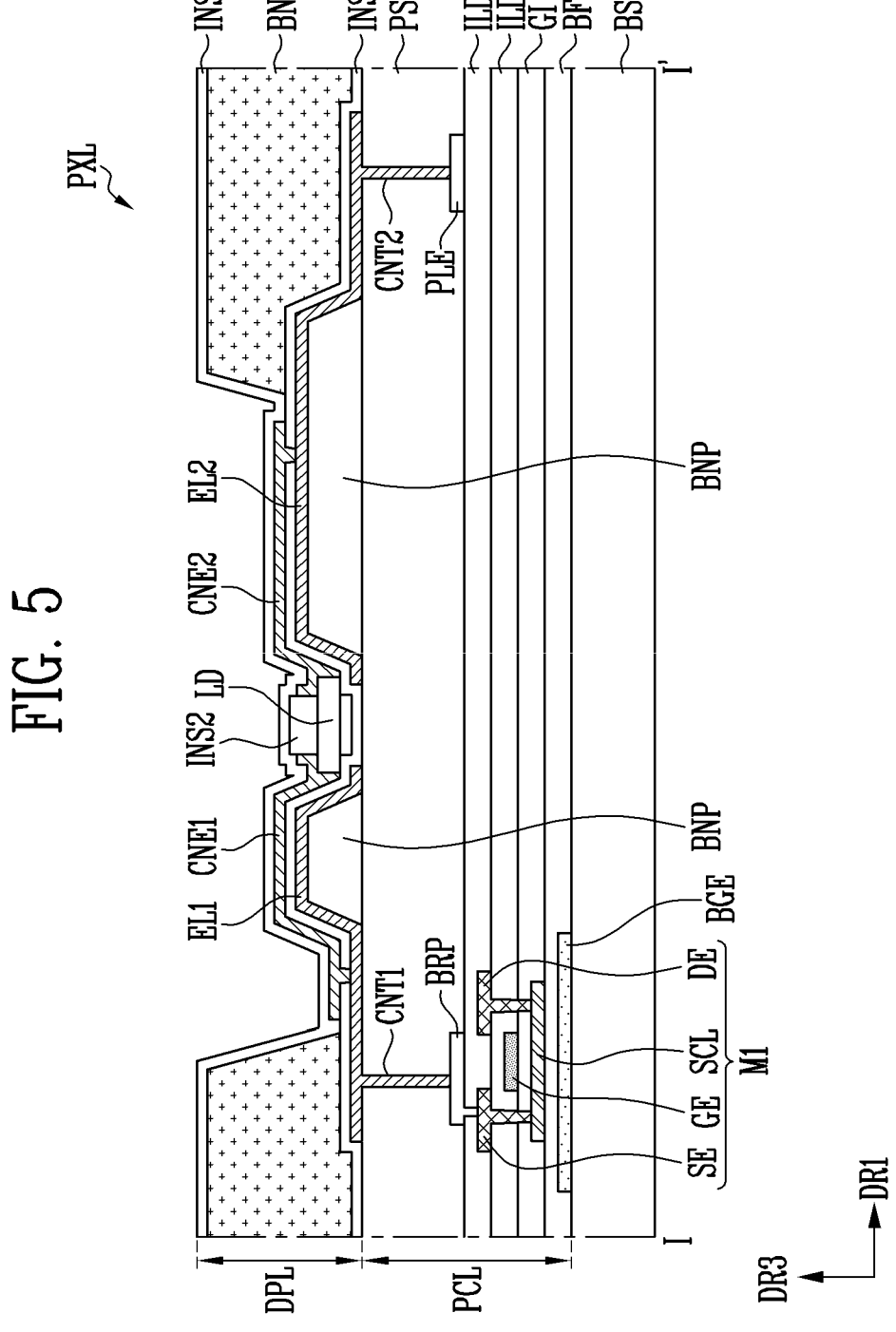
FIG. 5 is a cross-sectional view taken along line I-I' of FIG. 3.

FIG. 5 is a cross-sectional view taken along line I-I' of FIG. 3. FIG. 5 may be a diagram schematically showing the cross-section of the pixel PXL.

Referring to FIG. 5, the pixel PXL may include a base layer BSL, a pixel circuit layer PCL, and a display element layer DPL. For the sake of explanation, FIG. 5 illustrates the configuration of a transistor corresponding to the first transistor M1 selected from among the first to third transistors M1 to M3 shown in FIG. 4.

The base layer BSL may be a rigid and/or soft substrate. According to an example, the base layer BSL may include a rigid material and/or a flexible material. For example, the flexible material may include the following: polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, cellulose triacetate, and/or cellulose acetate propionate. However, the material of the base layer BSL applied to the embodiment of the present disclosure is not limited to a specific example material.

The pixel circuit layer PCL may include a buffer layer BFL, a back gate electrode BGE, a first transistor M1, a gate insulating layer GI, a first interlayer insulating layer ILD1, a second interlayer insulating layer ILD2, and a bridge pattern BRP, a power line PLE, a first contact part CNT1, a second contact part CNT2, and a passivation layer PSV.

The buffer layer BFL may be on the base layer BSL. The buffer layer BFL may prevent or reduce diffusion of impurities from the outside. The buffer layer BFL may include a metal oxides such as, for example, silicon nitride (SiNx), silicon oxide (SiOx), silicon oxynitride (SiOxNy), and/or aluminum oxide (AlOx).

The back gate electrode BGE may be on the base layer BSL. At least a portion of the back gate electrode BGE may be covered by the buffer layer BFL. The back gate electrode BGE may overlap the gate electrode GE in a plan view.

The first transistor M1 may be referred to as a thin film transistor. In an example, the first transistor M1 may be a driving transistor in the thin film transistor. The first transistor M1 may include a semiconductor layer SCL, a gate electrode GE, a source electrode SE, and a drain electrode DE.

The semiconductor layer SCL may be on the buffer layer BFL. The semiconductor layer SCL may include polysilicon, amorphous silicon, and/or an oxide semiconductor (e.g. Indium Gallium Zinc Oxide (IGZO)).

The semiconductor layer SCL may include a first contact area that is in contact (e.g., physical contact) with the source electrode SE, and a second contact area that is in contact (e.g., physical contact) with the drain electrode DE.

Each of the first and second contact areas may be a semiconductor pattern doped with impurities. An area between the first contact area and the second contact area may be a channel area. The channel area may be an intrinsic semiconductor pattern undoped with impurities.

The gate insulating layer GI may be on the semiconductor layer SCL. The gate insulating layer GI may include an inorganic material. For example, the gate insulating layer GI may include silicon nitride (SiNx), silicon oxide (SiOx), silicon oxynitride (SiOxNy), and/or aluminum oxide (AlOx). In an embodiment, the gate insulating layer GI may include an organic material.

A gate electrode GE may be on the gate insulating layer GI. A position of the gate electrode GE may correspond to a position of the channel area of the semiconductor layer SCL. For example, the gate electrode GE may be on the channel area of the semiconductor layer SCL with the gate insulating layer GI being interposed therebetween.

A first interlayer insulating layer ILD1 may be on the gate electrode GE. Similarly to the gate insulating layer GI, the first interlayer insulating layer ILD1 may include silicon nitride (SiNx), silicon oxide (SiOx), silicon oxynitride (SiOxNy), and/or aluminum oxide (AlOx).

The source electrode SE and the drain electrode DE may be on the first interlayer insulating layer ILD1. The source electrode SE may pass through the gate insulting layer GI and the first interlayer insulating layer ILD1 to contact (e.g., physically contact) the first contact area of the semiconductor layer SCL, while the drain electrode DE may pass through the gate insulting layer GI and the first interlayer insulating layer ILD1 to contact (e.g., physically contact) the second contact area of the semiconductor layer SCL.

A second interlayer insulating layer ILD2 may be on the source electrode SE and the drain electrode DE. Similarly to the first interlayer insulating layer ILD1 and the gate insulating layer GI, the second interlayer insulating layer ILD2 may include an inorganic material. The inorganic material may include the materials forming the first interlayer insulating layer ILD1 and the gate insulating layer GI, for instance, including silicon nitride (SiNx), silicon oxide (SiOx), silicon oxynitride (SiOxNy), and/or aluminum oxide (AlOx). In an embodiment, the second interlayer insulating layer ILD2 may include an organic material.

The bridge pattern BRP may be on the second interlayer insulating layer ILD2. The bridge pattern BRP may be electrically coupled to the source electrode SE through a contact hole passing through the second interlayer insulating layer ILD2.

The power line PLE may be on the second interlayer insulating layer ILD2. The power line PLE may receive power from the second power source VSS described above with reference to FIG. 4.

The passivation layer PSV may be on the second interlayer insulating layer ILD2. The passivation layer PSV may cover the bridge pattern BRP and the power line PLE.

The passivation layer PSV may be a via layer. The passivation layer PSV may be in the form of an organic insulating layer, an inorganic insulating layer, or the organic insulating layer on the inorganic insulating layer.

The passivation layer PSV may include the first contact part CNT1 that is electrically coupled to an area of the bridge pattern BRP, and the second contact part CNT2 that is electrically coupled to an area of the power line PLE.

The display element layer DPL may include a bank pattern BNP, a first electrode EL1, a second electrode EL2, a first insulating layer INS1, a light emitting element LD, a first contact electrode CNE1, a second contact electrode CNE2, a second insulating layer INS2, a bank BNK, and a third insulating layer INS3.

The bank pattern BNP may protrude upwards, and the first electrode EL1 and the second electrode EL2 may be arranged on the bank pattern BNP to form a reflective partition wall. The reflective partition wall may improve the light efficiency of the light emitting element LD.

The first electrode EL1 may be on the passivation layer PSV. The first electrode EL1 may be a path to which the voltage of the first power source VDD described above with reference to FIG. 4 may be applied, and may be a path through which electrical information on the light emitting element LD may be provided.

The second electrode EL2 may be on the passivation layer PSV. The second electrode EL2 may be a path to which the voltage of the second power source VSS described above with reference to FIG. 4 may be applied.

The first electrode EL1 and the second electrode EL2 may reflect light emitted from the light emitting element LD in a display direction so that the light emitting efficiency of the light emitting element LD is improved. In this case, the display direction may be a third direction DR3.

The first insulating layer INS1 may be on the passivation layer PSV. Similarly to the second interlayer insulating layer ILD2, the first insulating layer INS1 may include silicon nitride (SiNx), silicon oxide (SiOx), silicon oxynitride (SiON), and/or aluminum oxide (AlOx).

At least a portion of the first insulating layer INS1 may be on the first contact electrode CNE1, the second contact electrode CNE2, the first electrode EL1, and/or the second electrode EL2 to stabilize electrical connection and reduce external influences.

The light emitting element LD may be on the first insulating layer INS1. For example, the first insulating layer INS1 may have a set or predetermined groove, at least a portion of the light emitting element LD may contact (e.g., physically contact) an end formed from the groove, and another portion of the light emitting element LD may contact (e.g., physically contact) another end formed by the groove.

The light emitting element LD may be on the first insulating layer INS1 between the first electrode EL1 and the second electrode EL2. The light emitting element LD may be an element including an inorganic material having a size in a range from a nanometer scale to a micrometer scale.

The light emitting element LD may include a first semiconductor layer, a second semiconductor layer, an active layer, and an insulating layer. The first semiconductor layer may include a semiconductor layer having a set or predetermined type or kind, and the second semiconductor layer may include a semiconductor layer of a type or kind that is different from that of the first semiconductor layer. For instance, the first semiconductor layer may include an N-type semiconductor layer, and the second semiconductor layer may include a P-type semiconductor layer.

For example, each of the first and second semiconductor layers may include at least one semiconductor material including InAlGaN, GaN, AlGaN, InGaN, AlN, and/or InN.

The active layer may be between the first semiconductor layer and the second semiconductor layer. The active layer may have a single or multiple quantum well structure.

When an electric field of a set or predetermined voltage or higher is applied to both ends of the light emitting element LD, electron-hole pairs may be coupled in the active layer to emit light.

The second insulating layer INS2 may be on the light emitting element LD. The second insulating layer INS2 may cover an area corresponding to the active layer of the light emitting element LD. The second insulating layer INS2 may include an organic material and/or an inorganic material.

According to an embodiment, at least a portion of the second insulating layer INS2 may be on the rear surface of the light emitting element LD. The second insulating layer INS2 on the rear surface of the light emitting element LD may fill an empty gap between the first insulating layer INS1 and the light emitting element LD while the second insulating layer INS2 is on the light emitting element LD.

The first contact electrode CNE1 and the second contact electrode CNE2 may be on the first insulating layer INS1. The first contact electrode CNE1 and the second contact electrode CNE2 may be electrically coupled to the first electrode EL1 and the second electrode EL2 through the contact hole that is in the first insulating layer INS1.

The first contact electrode CNE1 and the second contact electrode CNE2 may include conductive materials including Indium Tin Oxide (ITO), Indium Zinc Oxide (IZO), and/or Indium Tin Zinc Oxide (ITZO).

An electric signal provided through the first electrode EU may be transmitted to the light emitting element LD through the first contact electrode CNE1. At this time, the light emitting element LD may emit light based on the transmitted electric signal.

An electric signal provided through the second electrode EL2 may be transmitted to the light emitting element LD through the second contact electrode CNE2.

The bank BNK may be a structure defining an emission area of the pixel PXL. The emission area EMA may mean an area in which light is emitted from the light emitting element LD. For example, the bank BNK may be in a boundary area between adjacent light emitting elements LD to enclose the light emitting element LD of the pixel PXL.

The third insulating layer INS3 may be arranged on the bank BNK, the first contact electrode CNE1, the second contact electrode CNE2, and the second insulating layer INS2. The third insulating layer INS3 may include an organic material and/or an inorganic material. The third insulating layer INS3 may protect the display element layer DPL against external influences.

The arrangement relationship of the light emitting element LD, the electrode, etc. is not limited to the example described above with reference to FIG. 5, and arrangement relationships according to various suitable modifications may be implemented.

Hereinafter, the open area OPA of the display device according to the embodiment will be described with reference to FIGS. 6 to 11.

Figure 6:
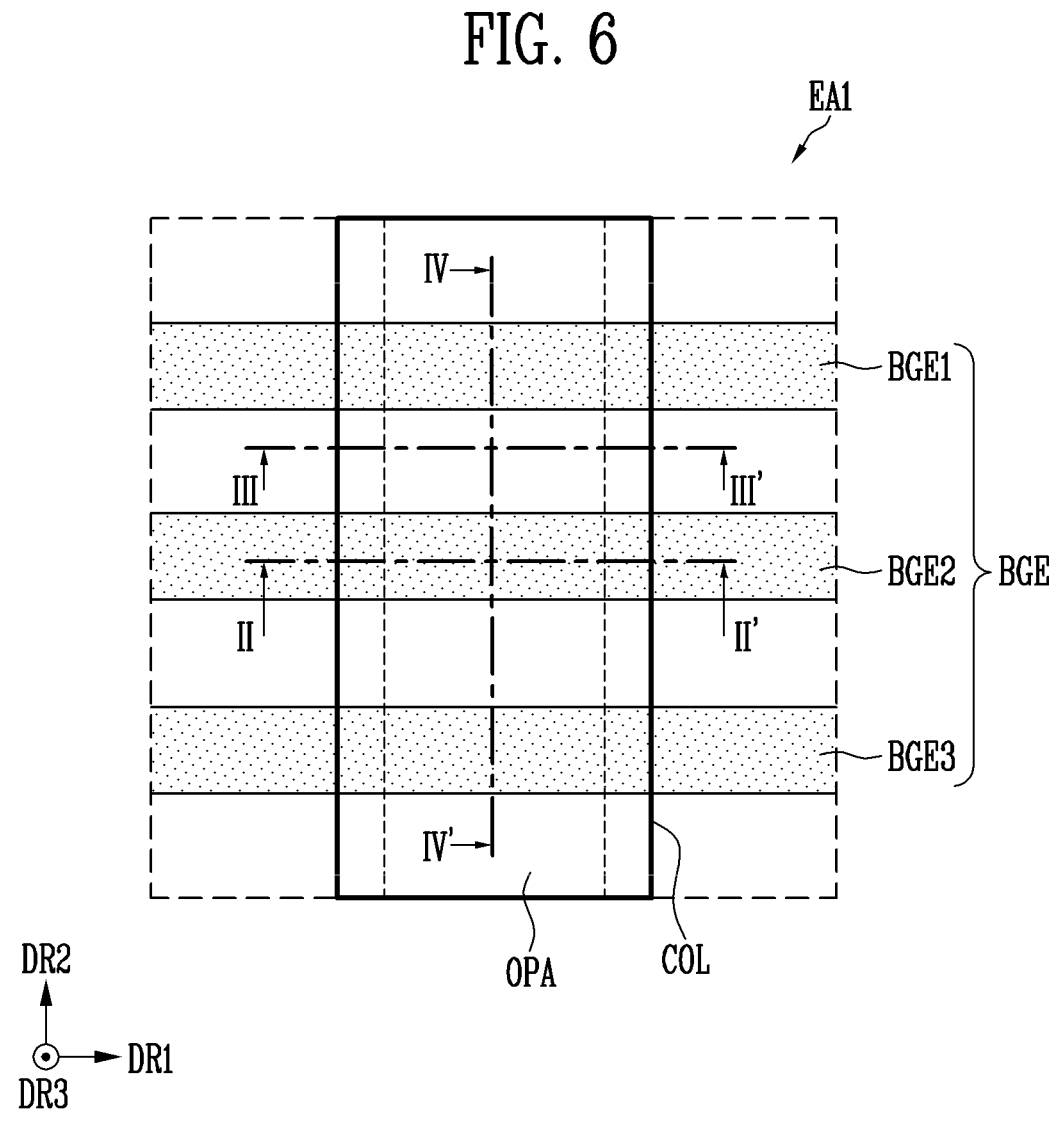
Figure 7:
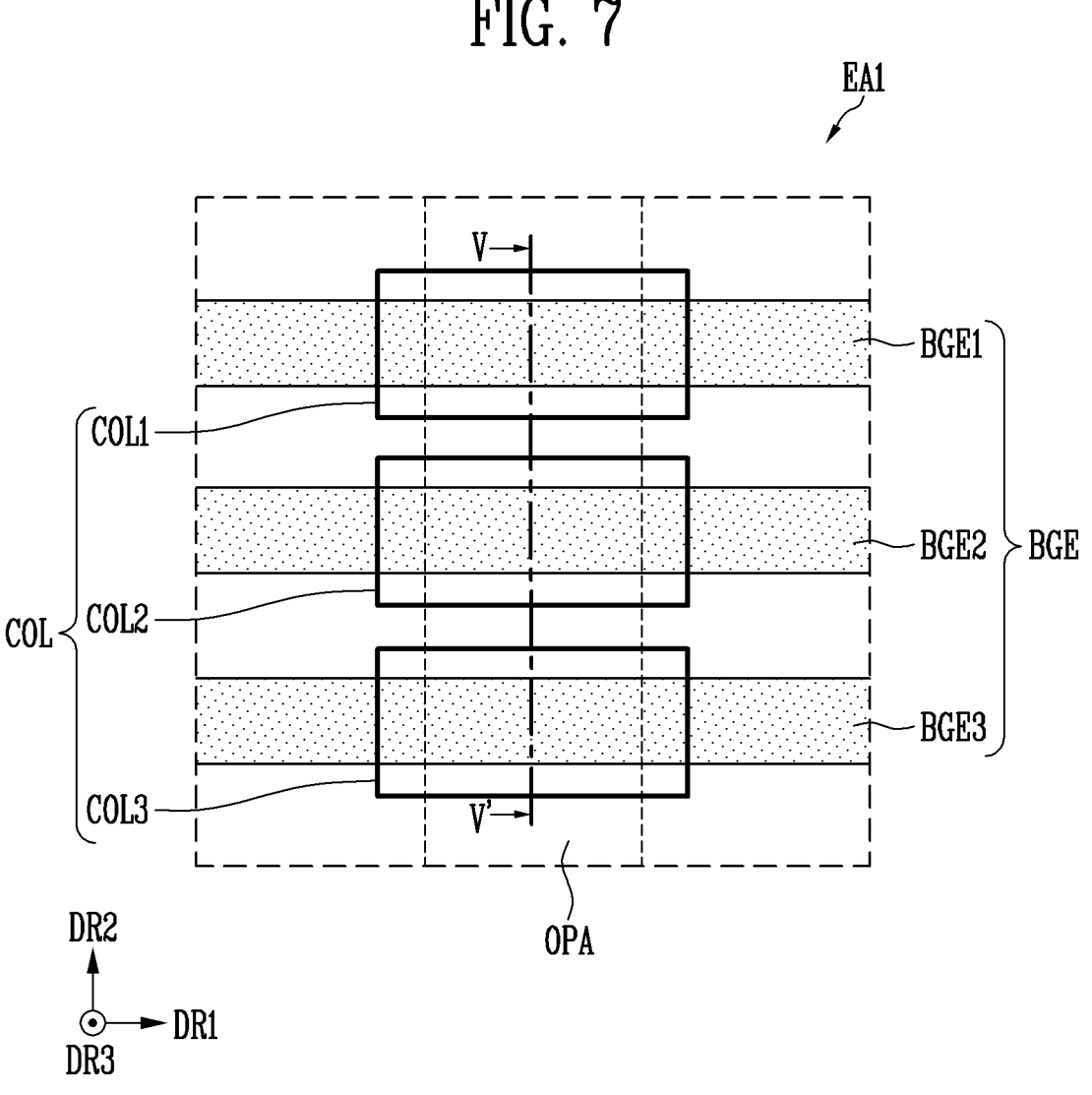
Figures 8, 9:
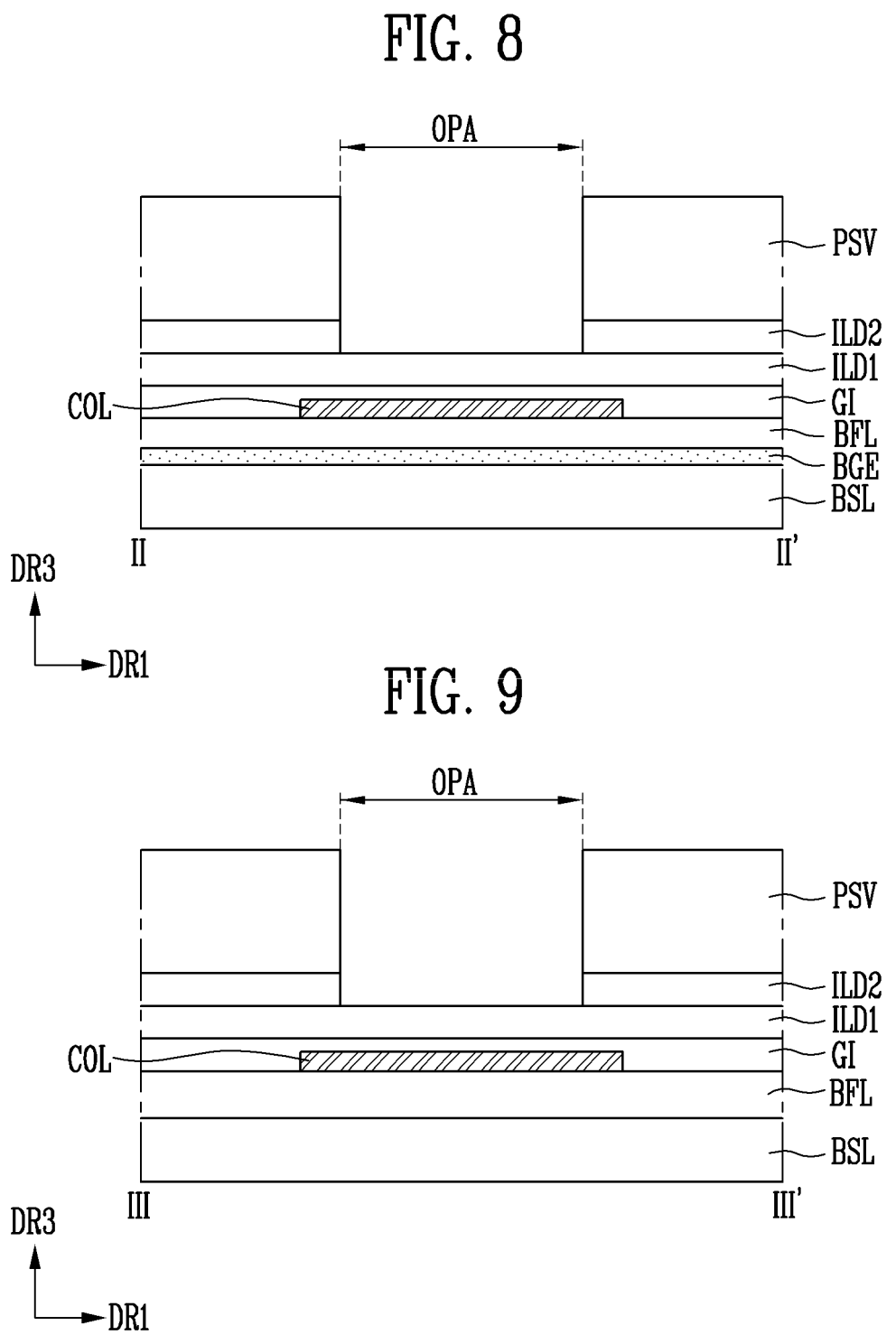
Figure 10:
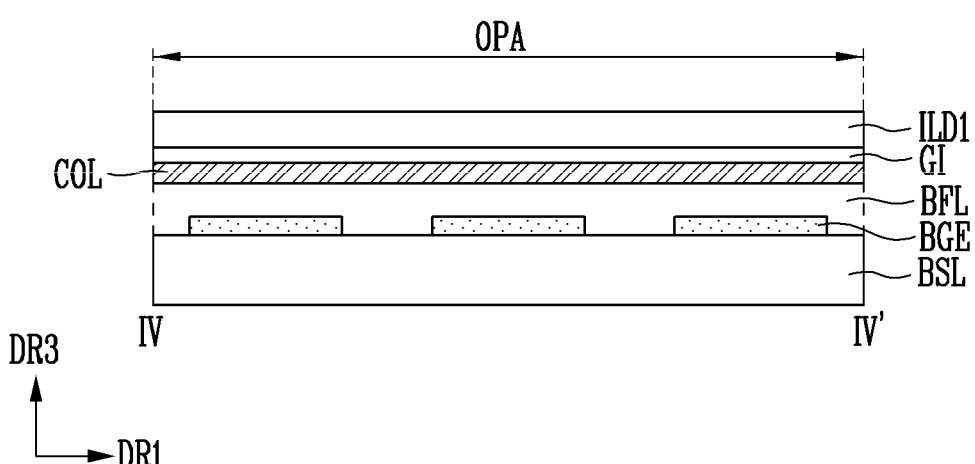
FIG. 10 is a cross-sectional view taken along line IV-IV' of FIG. 6.
Figure 11:
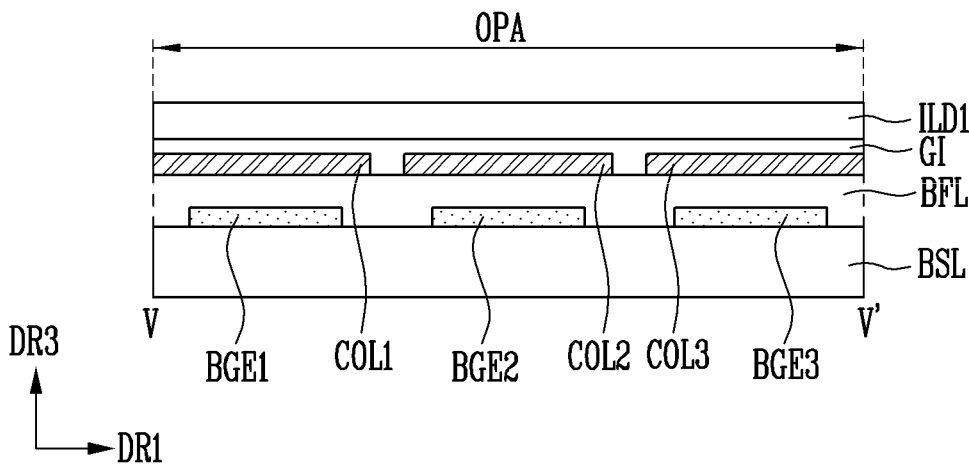
FIG. 11 is a cross-sectional view taken along line V-V' of FIG. 7.

FIGS. 6 and 7 are enlarged views illustrating area EA1 of FIG. 3. FIG. 8 is a cross-sectional view taken along line II-II' of FIG. 6. FIG. 9 is a cross-sectional view taken along line III-III' of FIG. 6. FIG. 10 is a cross-sectional view taken along line IV-IV' of FIG. 6. FIG. 11 is a cross-sectional view taken along line V-V' of FIG. 7.

Referring to FIGS. 6 to 11, a cover layer COL capable of covering the back gate electrode BGE and at least a portion of the back gate electrode BGE may be provided. In FIGS. 6 and 7, separate patterning is not performed on the cover layer COL for the clarity of description.

A plurality of back gate electrodes BGE may be formed, and each back gate electrode may extend in a set or predetermined direction. The back gate electrode BGE may extend in the first direction DR1 in the open area OPA. However, without being limited thereto, at least a portion of the back gate electrode BGE may extend in a direction between the second direction DR2 and the first direction DR1 or in the second direction DR2 in the open area OPA.

The back gate electrode BGE may overlap the cover layer COL in a plan view. The back gate electrode BGE may be included in an area corresponding to the cover layer COL in a plan view. For example, referring to FIGS. 6 and 10, the cover layer COL in accordance with an embodiment may be in an area wider than the open area OPA in a plan view, thus covering the open area OPA. Thus, the cover layer COL may cover all of the back gate electrodes BGE that are physically spaced apart from each other.

Referring to FIGS. 7 to 11, the cover layer COL according to an embodiment may comprise a plurality of cover layers that are physically spaced apart from each other in the open area OPA. For example, the cover layer COL may include a first cover layer COL1, a second cover layer COL2, and a third cover layer COL3 which are physically spaced apart from each other in the open area OPA in a plan view. The back gate electrode BGE may include a first back gate electrode BGE1, a second back gate electrode BGE2, and a third back gate electrode BGE3 which are physically spaced apart from each other in the open area OPA in a plan view. Here, the first back gate electrode BGE1 may overlap the first cover layer COL1 in a plan view, but may not overlap the second and third cover layers COL2 and COL3. The second back gate electrode BGE2 may overlap the second cover layer COL2 in a plan view, but may not overlap the first and third cover layers COL1 and COL3. The third back gate electrode BGE3 may overlap the third cover layer COL3 in a plan view, but may not overlap the first and second cover layers COL1 and COL2.

The cover layer COL may be on the same layer as the semiconductor layer SCL described above with reference to FIG. 5. Similarly to the semiconductor layer SCL, the cover layer COL may be on the buffer layer BFL, so that at least a portion of the cover layer COL may be covered by the gate insulating layer GI.

The cover layer COL may be formed in the same process as the semiconductor layer SCL. The semiconductor layer SCL and the cover layer COL may be formed (or acquired) at the same time (e.g., substantially the same time).

For example, the semiconductor layer SCL and the cover layer COL may be formed during one process in which a single mask is used. A set or predetermined material for providing the semiconductor layer SCL and the cover layer COL may be stacked on the buffer layer BFL, and a photo process and an etching process may be performed on the stacked material. Consequently, the cover layer COL may be formed even when a separate mask other than a mask provided to form the semiconductor layer SCL is not provided.

The cover layer COL may include the same (e.g., substantially the same) material as the semiconductor layer SCL. In an embodiment, the cover layer COL and the semiconductor layer SCL may be at least a portion of material stacked in the same process, and may be made of substantially the same material.

In an example, the cover layer COL may include polysilicon, amorphous silicon, and/or an oxide semiconductor (e.g. Indium Gallium Zinc Oxide (IGZO)), but the present disclosure is not limited thereto.

Referring to FIGS. 8 to 11, at least some layers may be removed from the open area OPA. The via layer may not be arranged in the open area OPA. For example, referring to FIGS. 8 to 11, the passivation layer PSV and the second interlayer insulating layer ILD2 may not be arranged in the open area OPA. Thus, an opening may be in the passivation layer PSV and the second interlayer insulating layer ILD2. The passivation layer PSV and the second interlayer insulating layer ILD2 may include the opening. The opening and the open area OPA may overlap each other in a plan view.

The open area OPA may reduce external influences on individual components in the display panel PNL. For example, the open area OPA may be formed along the perimeter of the display panel PNL to reduce the influence of moisture and/or fine particles that may be provided from the outside. External influences on the first to third transistors M1 to M3 in the display area DA may be reduced.

The external influences may be reduced because the inside and the outside of the display panel PNL are divided by the open area OPA as a boundary. For example, when a separate open area OPA is not provided and any one of the individual layers is implemented as an organic insulating layer, the organic insulating layer has high moisture permeability, and water may easily penetrate the inner area of the display panel PNL. In this case, the open area OPA, which is an area from which an individual layer (e.g. the passivation layer PSV) implemented as an organic insulating layer has been removed may be provided to reduce water penetration.

Referring to FIGS. 8 and 9, at least one of the individual layers may not be in the open area OPA. For example, the passivation layer PSV and the second interlayer insulating layer ILD2 may not be in the open area OPA. However, without being limited thereto, at least some of various suitable layers may be removed from the open area OPA. For example, only the passivation layer PSV may be removed or the passivation layer PSV, the first interlayer insulating layer ILD1, and the second interlayer insulating layer ILD2 may be removed from the open area OPA. Hereinafter, for the sake of explanation, the layers removed from the open area OPA are described as being the passivation layer PSV and the second interlayer insulating layer ILD2. However, the present disclosure is not limited thereto, and various embodiments may be implemented.

For clarity of explanation, FIGS. 8 to 11 illustrate that a separate material is not in an area from which at least a portion has been removed. As a separate process is performed after the open area OPA is formed, an insulating layer including at least one of an organic material or an inorganic material may be provided. In this case, the insulating layer may be in the open area OPA to be arranged on the same layer as the passivation layer PSV.

The cover layer COL may overlap the open area OPA in a plan view. The back gate electrode BGE that is not arranged in the open area OPA may not overlap with the cover layer COL, but the cover layer COL may at least overlap the back gate electrode BGE in the open area OPA in a plan view.

The cover layer COL may protect the back gate electrode BGE when the process for forming the open area OPA is performed. The cover layer COL may function as an etch stopper layer for the back gate electrode BGE during an etching process for forming the open area OPA.

In the display device according to an embodiment, even when the cover layer COL is provided and the etching process for forming the open area OPA is performed, damage to the back gate electrode BGE may be prevented or reduced. Moreover, the cover layer COL is patterned in the same mask process as the semiconductor layer SCL in the display device, and thus, a separate mask is not required. In other words, even when an additional configuration for generating the above-described technical effect is provided, additional process cost may be reduced.

An embodiment of the present disclosure provides a display device which can reduce external influences and prevent or reduce damage to electrode components during an etching process.

The present disclosure is not limited to the above-described effects, and other effects that are not mentioned will be clearly understood by those skilled in the art from the present specification and the accompanying drawings.

The above description is merely illustrative of the technical idea of the present disclosure, and it is apparent to those of ordinary skill in the art that the present disclosure may be changed and modified in various suitable ways without departing from the scope of the present disclosure. Therefore, the above-described embodiments may be implemented separately or in combination.

Therefore, as the present embodiments are illustrative and not restrictive, it should be understood that the technical spirit of the present disclosure is not limited to the specific embodiments. The scope of the present disclosure is therefore to be determined solely by the appended claims, and equivalents thereof. All technical ideas within an equivalent scope should be interpreted as being included in the scope of the present disclosure.

What is claimed is:

1. A display device including a display area, a non-display area, and an open area between the display area and the non-display area, the display device comprising:

a substrate;

a transistor on the substrate;

a back gate electrode, wherein at least a portion of the back gate electrode overlaps the transistor and at least another portion of the back gate electrode overlaps the open area; a passivation layer on the transistor, and including an opening that overlaps the open area; and a cover layer overlapping the back gate electrode in the opening, wherein the transistor comprises a semiconductor layer comprising a first material, and the cover layer comprises the first material, wherein the cover layer is between the passivation layer and the substrate, wherein the open area is defined as an area where the passivation layer is not arranged, wherein the back gate electrode is disposed between the substrate and the passivation layer, and wherein a portion of the cover layer is disposed in the opening in a plan view, the portion of the cover layer does not contact the back gate electrode and the passivation layer.

2. The display device according to claim 1, wherein the semiconductor layer and the cover layer are made of the same material.

3. The display device according to claim 1, wherein the first material comprises polysilicon, amorphous silicon, and/or oxide semiconductor.

4. The display device according to claim 1, further comprising an interlayer insulating layer on the semiconductor layer, and including an opening that overlaps with the open area.

5. The display device according to claim 1, wherein at least a portion of the back gate electrode is arranged between the substrate and the transistor, and another portion of the back gate electrode is arranged between the substrate and the cover layer.

6. The display device according to claim 5, wherein the cover layer comprises polysilicon, amorphous silicon, and/or oxide semiconductor to be an etch stopper layer for the back gate electrode arranged in the open area, when an etching process for the passivation layer is performed.

7. The display device according to claim 1, further comprising an insulating layer in the open area, and arranged on the same layer as the passivation layer.

8. The display device according to claim 1, wherein the back gate electrode comprises a first back gate electrode and a second back gate electrode that are arranged in the open area and are physically spaced apart from each other, and wherein the cover layer integrally covers the first back gate electrode and the second back gate electrode.

9. The display device according to claim 1, wherein the back gate electrode comprises a first back gate electrode and a second back gate electrode that are arranged in the open area and are physically spaced apart from each other, and wherein the cover layer comprises a first cover layer and a second cover layer that are arranged in the open area and are physically spaced apart from each other, the first cover layer overlapping the first back gate electrode, and the second cover layer overlapping the second back gate electrode in a plan view.

10. The display device according to claim 1, wherein the back gate electrode in the open area is arranged in an area where the cover layer is located, in a plan view.

11. The display device according to claim 1, wherein light is provided to an outside in the display area, and light is not provided to the outside in the non-display area.

12. The display device according to claim 1, wherein the open area is in a shape enclosing at least a portion of the display area.

13. The display device according to claim 1, further comprising:

a buffer layer on the back gate electrode;

wherein the semiconductor layer is on the buffer layer, and wherein the semiconductor layer and the cover layer are on the same layer.

14. The display device according to claim 13, wherein the semiconductor layer and the cover layer are covered by one insulating layer.

* * * * *